(12) United States Patent
Allman et al.

(10) Patent No.: US 6,288,454 B1
(45) Date of Patent: Sep. 11, 2001

(54) SEMICONDUCTOR WAFER HAVING A LAYER-TO-LAYER ALIGNMENT MARK AND METHOD FOR FABRICATING THE SAME

(75) Inventors: Derryl D. J. Allman; Curtis C. Hainds; Charles W. Jurgensen; Brian R. Lee, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/602,797

(22) Filed: Jun. 23, 2000

Related U.S. Application Data

(62) Division of application No. 09/311,253, filed on May 13, 1999, now Pat. No. 6,136,662.

(51) Int. Cl.$^7$ .................. H01L 23/544; H01L 23/52; H01L 29/06; H01L 21/76
(52) U.S. Cl. ............... 257/797; 257/758; 257/623; 438/401
(58) Field of Search ................... 257/797, 758, 257/623; 438/401, 424, 400, 427

(56) References Cited

U.S. PATENT DOCUMENTS

| | | | |
|---|---|---|---|
| 3,953,264 | * | 4/1976 | Wu ............................ 438/21 |
| 5,343,292 | | 8/1994 | Brueck et al. . |
| 5,525,840 | | 6/1996 | Tominaga . |
| 5,559,601 | | 9/1996 | Gallatin et al. . |
| 5,595,927 | * | 1/1997 | Chen et al. ..................... 437/52 |
| 5,596,413 | | 1/1997 | Stanton et al. . |
| 5,741,741 | * | 4/1998 | Tseng ............................ 438/637 |
| 5,772,905 | * | 6/1998 | Chou ............................ 216/44 |
| 5,786,116 | | 7/1998 | Rolfson . |
| 5,847,468 | | 12/1998 | Nomura et al. . |
| 5,897,371 | * | 4/1999 | Yeh et al. ..................... 438/633 |
| 5,952,241 | * | 9/1999 | Baker et al. .................. 438/691 |
| 5,985,764 | | 11/1999 | Lin et al. . |
| 6,046,094 | | 4/2000 | Jost et al. . |
| 6,046,101 | | 4/2000 | Dass et al. . |
| 6,080,635 | * | 6/2000 | Jang et al. ................... 438/401 |
| 6,133,111 | * | 10/2000 | Sur et al. ..................... 438/401 |
| 6,146,969 | * | 11/2000 | Tan et al. .................... 438/401 |

FOREIGN PATENT DOCUMENTS

11340341-A * 12/1999 (JP) ............... H01L/21/8246

* cited by examiner

Primary Examiner—Charles Bowers
Assistant Examiner—Brook Kebede

(57) ABSTRACT

A method of creating a layer-to-layer alignment mark in a semiconductor wafer includes the step of depositing a first conductor layer on a substrate associated with the semiconductor wafer. The method also includes the step of fabricating a number of alignment trenches in the first conductor layer. Moreover, the method includes the step of depositing a first insulator layer on the first conductor layer so as to fill the number of alignment trenches. Yet further, the method includes the step of removing material associated with the first insulator layer from the number of alignment trenches such that an upper surface of the first conductor layer and an upper surface of the first insulator layer define a first alignment step feature which possesses a predetermined height. The method also includes the step of depositing a second conductor layer on the semiconductor wafer subsequent to the removing step. A semiconductor wafer is also disclosed.

4 Claims, 7 Drawing Sheets

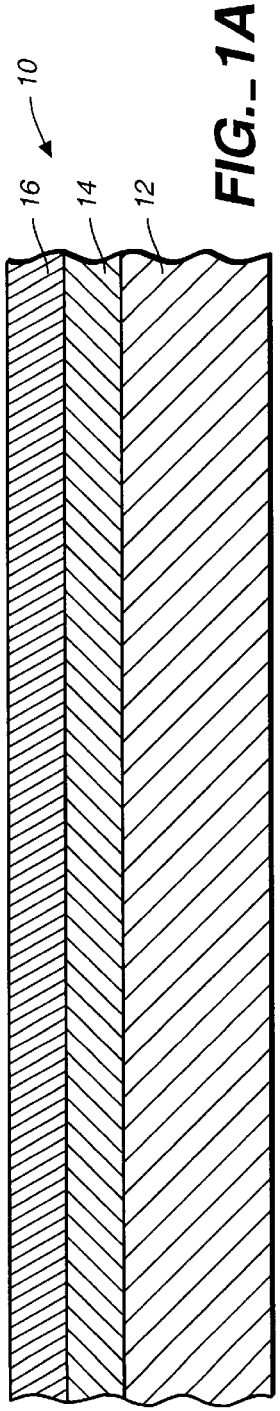
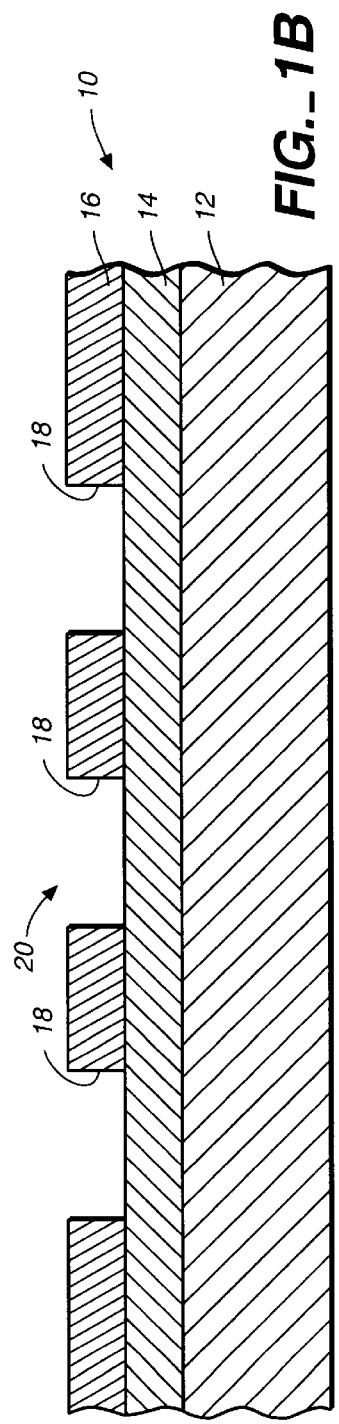
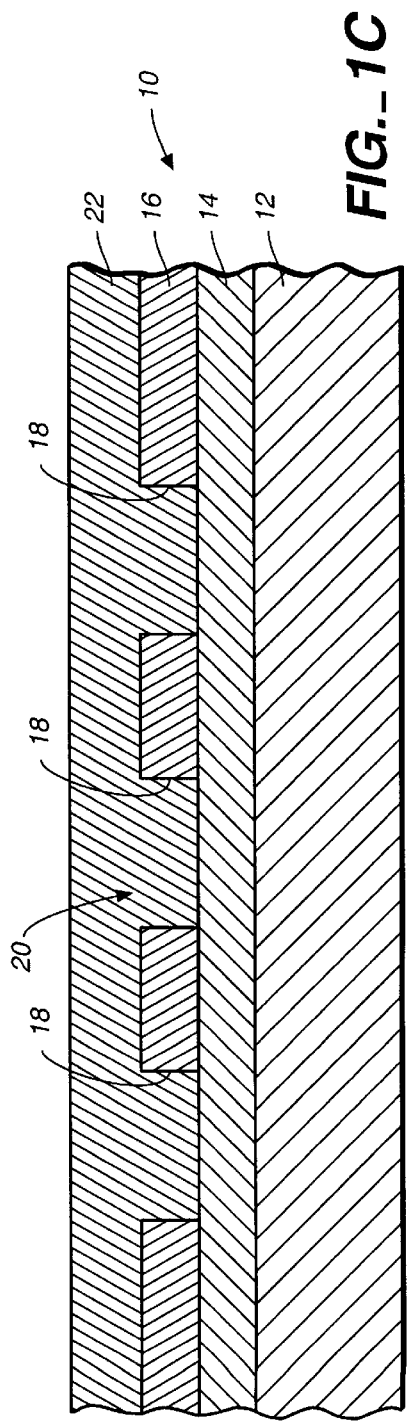

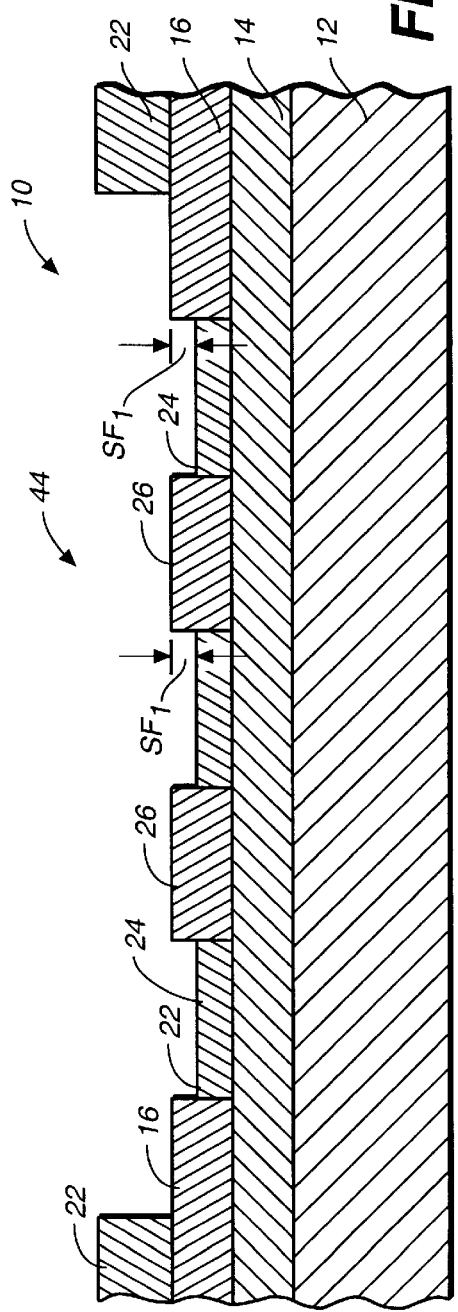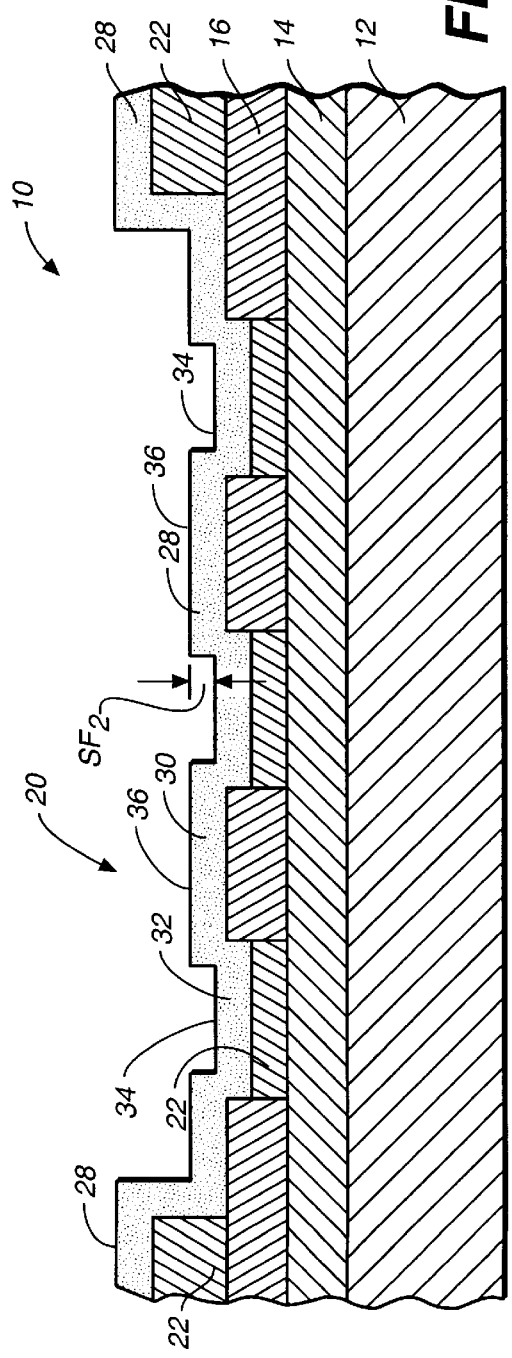

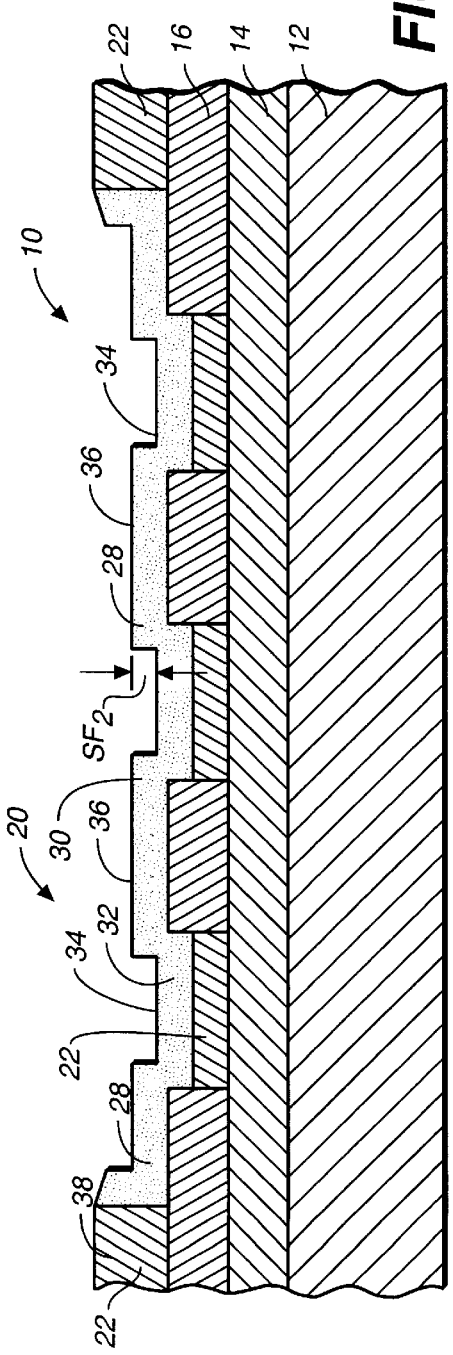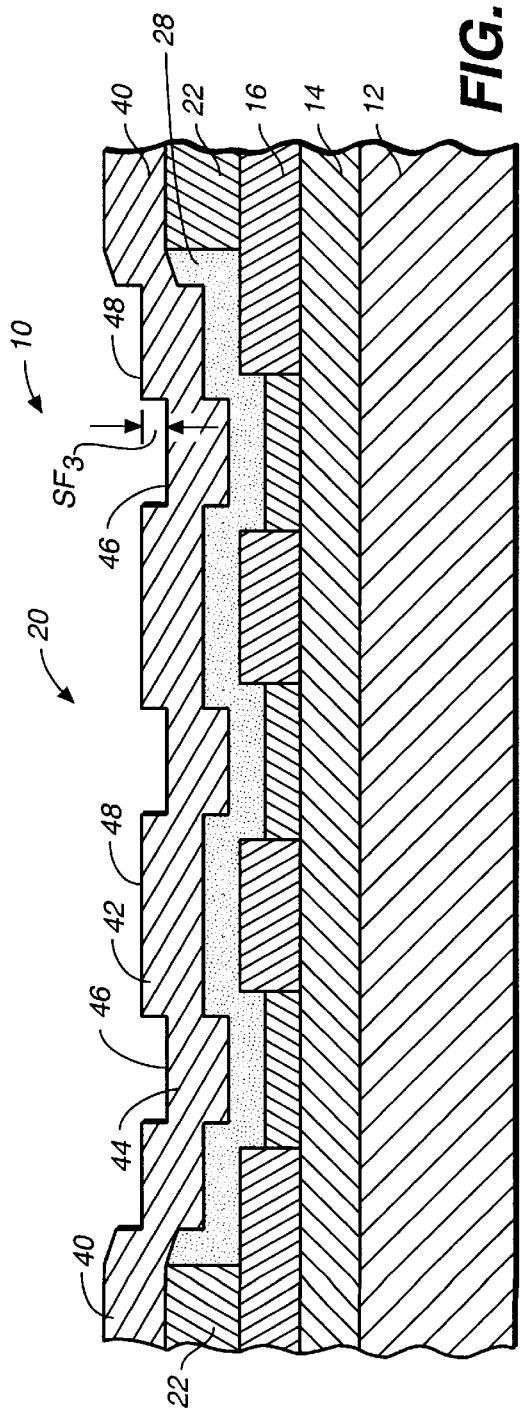

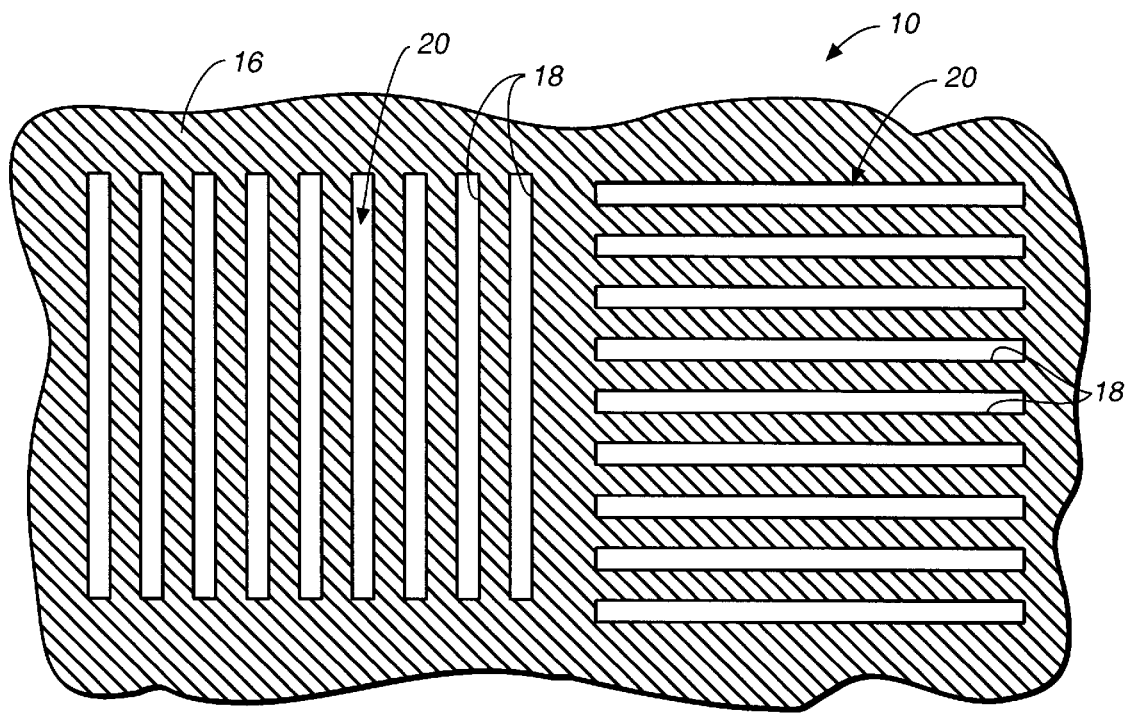
*FIG._2*
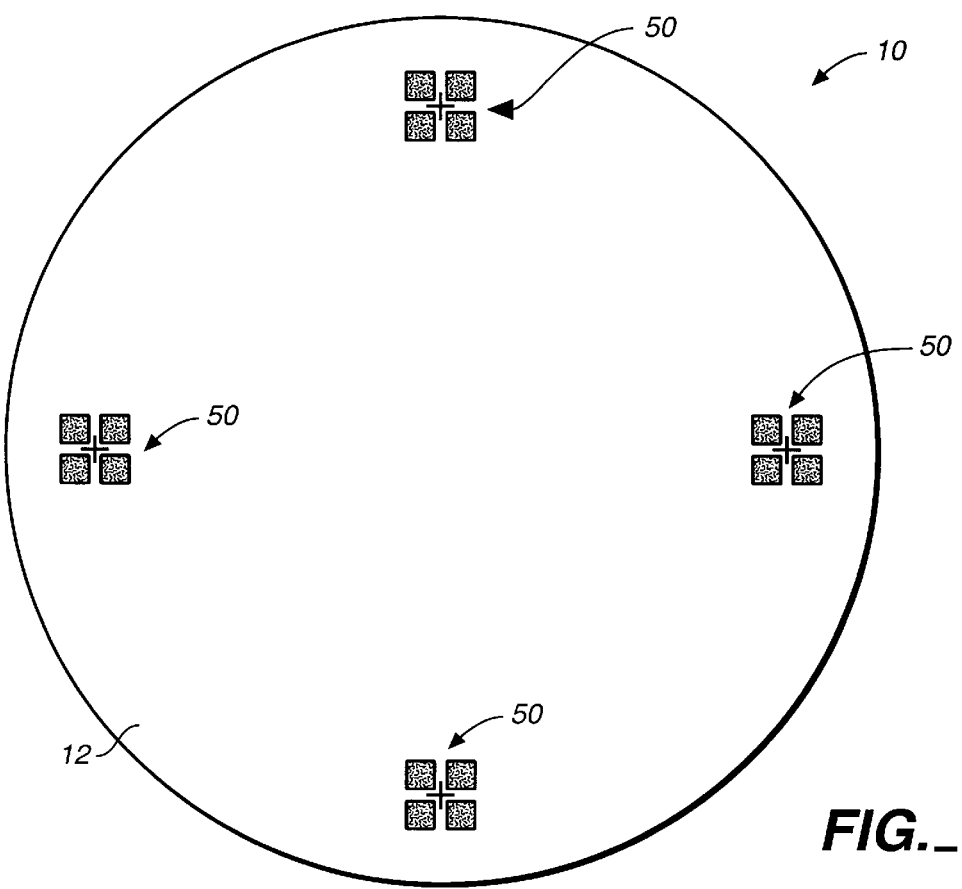
*FIG._3*

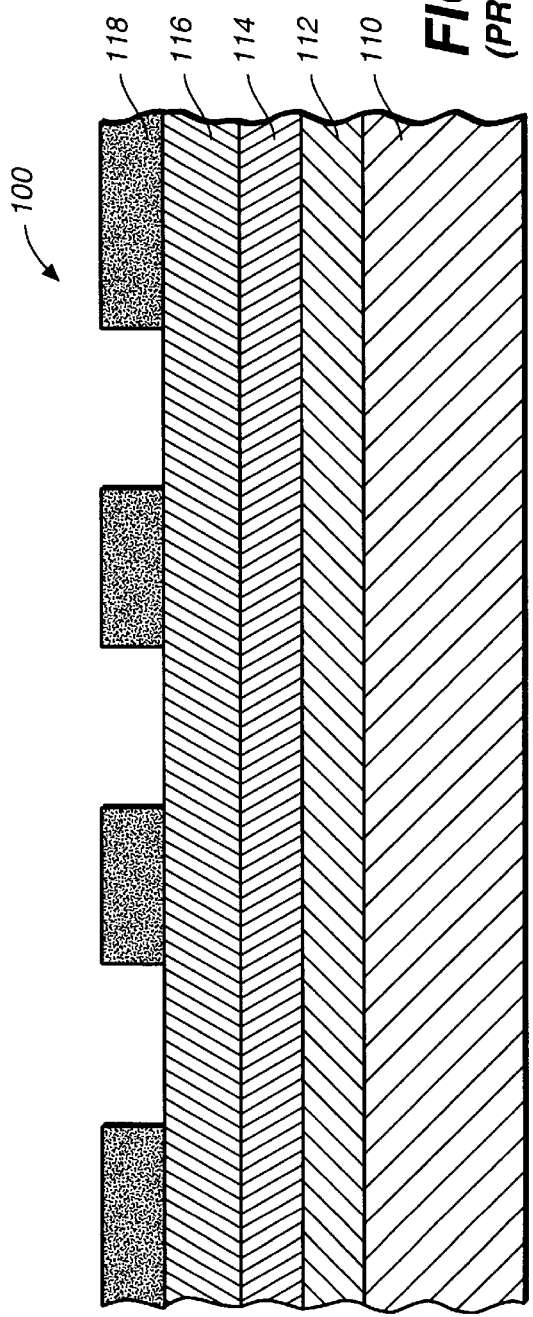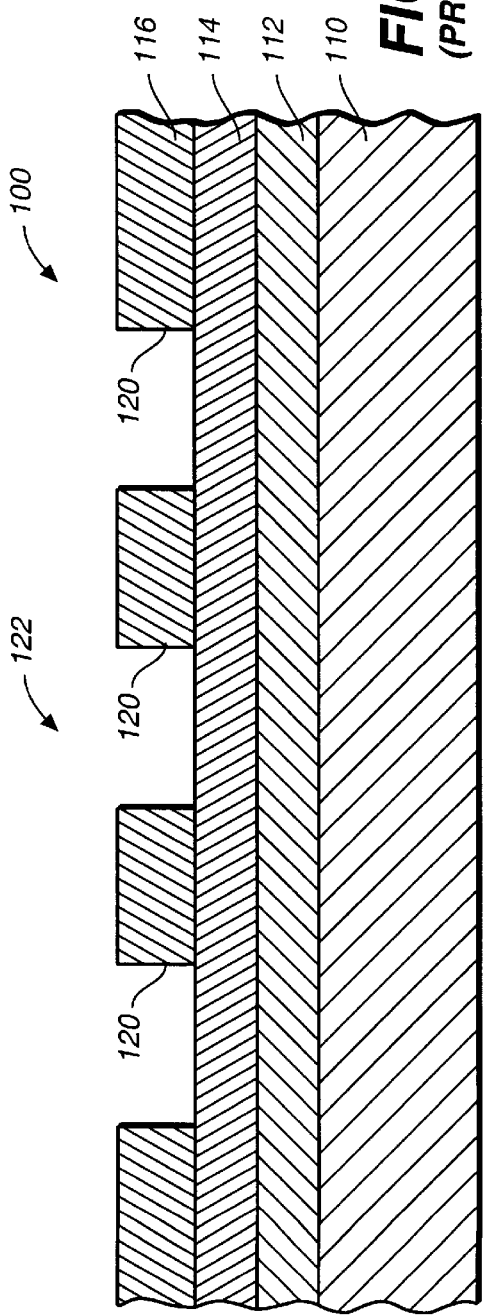
FIG._4A (PRIOR ART)
FIG._4B (PRIOR ART)

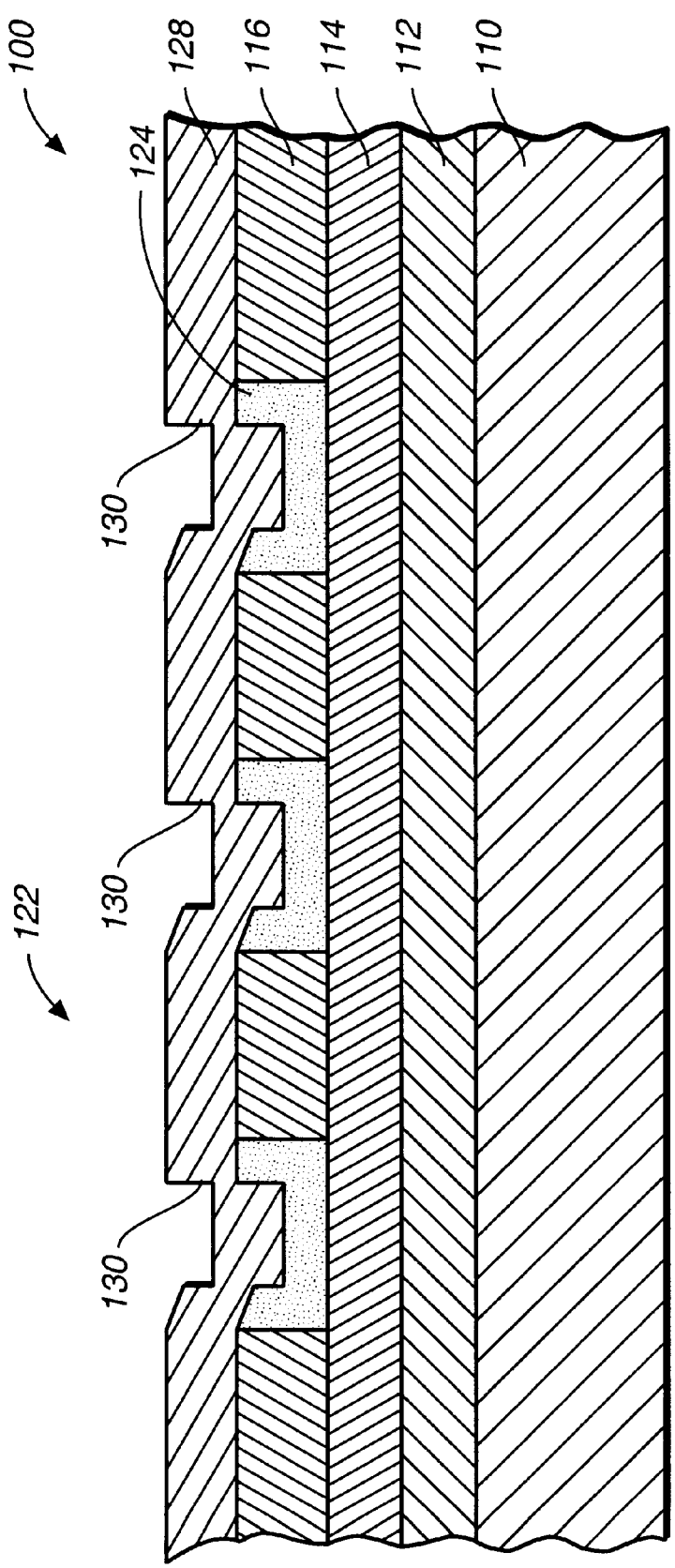
FIG._4E
(PRIOR ART)

SEMICONDUCTOR WAFER HAVING A LAYER-TO-LAYER ALIGNMENT MARK AND METHOD FOR FABRICATING THE SAME

This application is a divisional of application Ser. No. 09/311,253, filed May 13, 1999; now U.S. Pat. No. 6,136,662.

TECHNICAL FIELD OF THE INVENTION

The present invention relates generally to a semiconductor wafer, and more particularly to a semiconductor wafer having a layer-to-layer alignment mark and method for fabricating the same.

BACKGROUND OF THE INVENTION

The manufacture of semiconductor wafers to create semiconductor integrated circuit devices typically involves a sequence of processing steps which fabricate the multi-layer structure generally associated with the integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal.

It should be appreciated that during wafer fabrication, a given layer, including the features defined therein, must be aligned with one or more previous layers. For example, the vias associated with a given interlayer dielectric must be aligned with the pads or similar feature defined in the metal layer positioned below the interlayer dielectric. Hence, a semiconductor wafer typically has a number of alignment marks defined therein such that the patterning tools associated with a lithographic stepper can be aligned to the wafer during a lithography process.

One alignment mark arrangement which is commonly utilized is a "zero-level" phase grating arrangement. In such an arrangement, two or more diffraction gratings are etched into the silicon substrate of the semiconductor wafer prior to any other patterning. In order to align the wafer prior to patterning, the alignment system associated with the stepper impinges light on the alignment mark and thereafter collects and processes the first order diffraction spots from each of the diffraction gratings defined in the substrate. In this manner, subsequent layers may be aligned with previously fabricated layers in order to facilitate proper wafer fabrication.

One advantage to use of a zero-level alignment mark is that all subsequent alignments are performed relative to the same alignment mark. However, use of a zero-level alignment mark has a number of drawbacks associated therewith. For example, it is often difficult to maintain the topography of the alignment mark during the entire wafer fabrication process. In particular, the fabrication of the various subsequent layers often obscure the alignment mark thereby rendering the alignment mark undetectable by the alignment system associated with the stepper. Hence, wafer fabrication processes which have heretofore been designed typically include a number of processing steps which are dedicated to the "clearing" of the zero-level alignment marks. For example, fabrication processes which have heretofore been designed typically include a number of patterning and etch processes which are dedicated to material removal from the area proximate to the zero-level alignment marks. Such additional fabrication steps undesirably increase costs associated with fabrication of the semiconductor wafer.

In order to overcome the drawbacks associated with use of the zero-level alignment mark, a number of layer-to-layer alignment mark schemes have heretofore been developed. As shown in prior art FIGS. 4A–4E, the circuit patterning fabrication steps may be utilized to create alignment marks which are used for the alignment of subsequent circuit layers thereby eliminating the need to "clear" the zero-level alignment marks after each fabrication step. In particular, as shown in prior art FIG. 4A, a semiconductor wafer 100 is shown after via patterning of a first interlayer dielectric, but before via etching. More specifically, the semiconductor wafer 100 includes a silicon substrate 110 which has a pre-metal dielectric layer 112, a first metal layer 114, an inter-layer dielectric layer 116, and a patterned resist layer 118 fabricated thereon. Note that the resist layer 118 is patterned so as to create a number of vias in the interlayer dielectric layer 116 in order to electrically connect the first metal layer 114 to a subsequent metal layer. It should be appreciated that any patterning associated with fabrication of the layers shown in prior art FIG. 4A was aligned by use of a zero-level alignment mark (not shown) defined in the substrate 110.

As shown in prior art FIG. 4B, the semiconductor wafer 100 is then etched or otherwise processed so as to remove the portions of the inter-layer dielectric layer 116 not covered by the resist 118 so as to create a number of trenches 120 which collectively define a grating 122. Note that the resist layer 118 has been stripped from the semiconductor wafer 100 in prior art FIG. 4B. It should be appreciated that the print, etch, and strip process utilized to fabricate the trenches 120 in the inter-layer dielectric layer 116 are also utilized to fabricate a number of vias in the inter-layer dielectric layer 116 in the active regions of the semiconductor wafer 100 which will be utilized to electrically couple active circuit devices of the various layers to one another.

A conductive interconnect layer 124, such as tungsten, is then deposited on the semiconductor wafer 100 as shown in FIG. 4C. The tungsten layer 124 creates conductive plugs in the via holes which function to provide a conductive path through the vias in order to electrically couple the metal layer 114 to a subsequent metal layer. The material associated with the tungsten layer 124 is also deposited in the trenches 120 so as to form a second layer of trenches 126 associated with the alignment grating 122. Note that the step height of the trenches 122 is the same as the resultant step height of the trenches 126.

As shown in prior art FIG. 4D, in order to create a flat, planar surface for subsequent processing steps, the semiconductor wafer 100 is then polished, such as by chemical-mechanical polishing (CMP), in order to remove residual tungsten material prior to deposition of a subsequent metal layer. Once the semiconductor wafer 100 has been polished, a second metal layer 128 is then deposited on the semiconductor wafer 100. Note that deposition of the second metal layer 128 creates a third layer of trenches 130 associated with the alignment grating 122. It should be appreciated that the alignment grating 122 may then be utilized to align the alignment tools of a lithographic stepper (not shown) to the semiconductor wafer 100 in order to pattern circuit features in the second metal layer 128 thereby eliminating the need to utilize the zero-level alignment mark defined in the substrate 110 for such alignment. Moreover, it should be further appreciated that during fabrication of the second metal layer 128, a second inter-layer dielectric layer (not shown), a second interconnect layer (not shown), and a third metal layer, a similar alignment grating (not shown) may be fabricated at another location on the semiconductor wafer 100 in the same manner as the alignment grating 122 in order to facilitate alignment of subsequent layers.

However, the layer-to-layer alignment technique shown in prior art FIGS. 4A–4E has a number of drawbacks associated therewith. For example, the tungsten CMP process (see prior art FIG. 4D) creates an asymmetry in the alignment grating 122 that varies from location to location on the semiconductor wafer 100. Such asymmetry creates an offset between the true and apparent center of the trenches associated with the grating that undesirably results in misalignment. Certain of such misalignment may be accounted for during lithographic patterning; however, certain of such misalignment is random in nature thereby potentially causing defects in the semiconductor wafer 100 which undesirably increases costs associated with wafer fabrication.

Thus, a continuing need exists for a fabrication technique which accurately and efficiently creates layer-to-layer alignment marks.

SUMMARY OF THE INVENTION

In accordance with a first embodiment of the present invention, there is provided a method of creating a layer-to-layer alignment mark in a semiconductor wafer. The method includes the step of depositing a first conductor layer on a substrate associated with the semiconductor wafer. The method also includes the step of fabricating a number of alignment trenches in the first conductor layer so as to define an alignment grating. Moreover, the method includes the step of depositing a first insulator layer on the first conductor layer so as to fill each of the number of alignment trenches. Yet further, the method includes the step of removing material associated with the first insulator layer from each of the alignment trenches such that an upper surface of the first conductor layer and an upper surface of the first insulator layer define a first alignment step feature which possesses a predetermined height. The method also includes the step of depositing a second conductor layer on the semiconductor wafer subsequent to the removing step.

Pursuant to a second embodiment of the present invention, there is provided semiconductor wafer. The semiconductor wafer includes a substrate. The semiconductor wafer also includes a first conductor layer deposited on the substrate. The first conductor layer has a number of alignment trenches formed therein which define an alignment grating. The semiconductor wafer also includes a first insulator layer fabricated on the first conductor layer such that an upper surface of a portion of the first conductor layer positioned in the number of alignment trenches and an upper surface of the first insulator layer create a first alignment step feature which possesses a predetermined height. The semiconductor wafer also includes a second conductor layer deposited on the first conductor layer and the first insulator layer so as to create a second alignment step feature which possesses the predetermined height, wherein the second alignment step feature is configured so as to be utilized by an alignment tool in order to align the alignment tool to the semiconductor wafer.

Pursuant to a third embodiment of the present invention, there is provided a method of fabricating an alignment mark in a semiconductor wafer. The method includes the step of depositing a first conductor layer on a substrate associated with the semiconductor wafer. The method also includes the step of fabricating a number of alignment trenches in the first conductor layer. The method further includes the step of depositing a first insulator layer on the first conductor layer so as to fill the number of alignment trenches. Moreover, the method includes the step of removing material associated with the first insulator layer from the number of alignment trenches such that an upper surface of the first conductor layer and an upper surface of the first insulator layer define a first alignment step feature which possesses a predetermined height. The method yet further includes the step of depositing a second conductor layer on the semiconductor wafer subsequent to the removing step. The second conductor layer depositing step includes the step of depositing the second conductor layer on the semiconductor wafer such that a first portion of the second conductor layer is deposited on the first insulator layer within the number of alignment trenches, and a second portion of the second conductor layer is deposited on the first conductor layer. The first portion of the second conductor layer and the second portion of the second conductor layer define a second alignment step feature which possesses the predetermined height. The method also includes the step of depositing a third conductor layer on the semiconductor wafer. The method moreover includes the step of fabricating a number of circuit features in the third conductor layer. The step of fabricating the number of circuit features includes the step of aligning a first patterning tool to the second alignment step feature.

It is an object of the present invention to provide a new and useful semiconductor wafer.

It is also an object of the present invention to provide an improved semiconductor wafer.

It is further an object of the present invention to provide a new and useful method of fabricating a semiconductor wafer.

It is moreover an object of the present invention to provide an improved method of fabricating a semiconductor wafer.

It is also an object of the present invention to provide a method for fabricating a layer-to-layer alignment mark in a semiconductor wafer which does not require additional fabrication steps.

The above and other objects, features, and advantages of the present invention will become apparent from the following description and the attached drawings.

BRIEF DESCRIPTION OF THE DRAWINGS

FIGS. 1A–1G show fragmentary cross sectional views of a semiconductor wafer during various steps of a fabrication process which incorporates the features of the present invention therein;

FIG. 2 shows a fragmentary top elevational view of the semiconductor wafer of FIGS. 1A–1G;

FIG. 3 shows a top elevational view of the zero-level alignment marks of the semiconductor wafer of FIG. 1; and FIGS. 4A–4E show fragmentary cross sectional views of a prior art wafer fabrication process.

DETAILED DESCRIPTION OF A PREFERRED EMBODIMENT

Figure 4C:
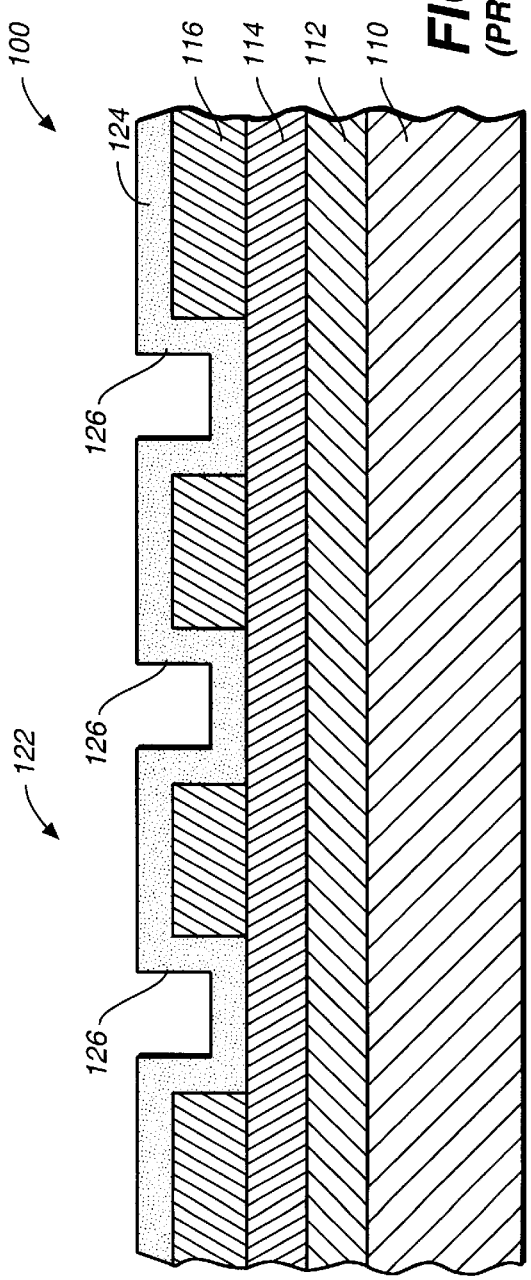
Figure 4D:
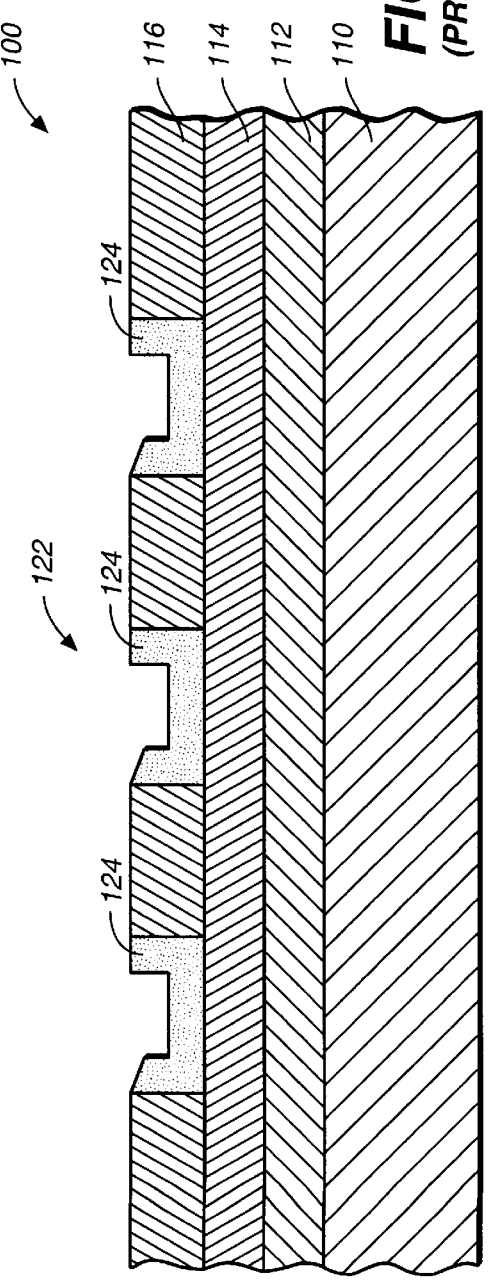

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIGS. 1A–1G, there is shown a semiconductor wafer 10 during various steps of a fabrication process of the present invention. As shown in FIG. 1, the semiconductor wafer 10 includes a substrate 12, such as silicon. The silicon substrate 12 has a pre-metal dielectric layer 14 deposited thereon. The contacts (not shown) to active components within the silicon substrate 12 such as the contacts to active silicon sources and drains, the contacts to gate electrodes, and the contacts to the top plates of poly poly capacitors are etched or otherwise fabricated in pre-metal dielectric layer 14 in the active areas of the semiconductor wafer 10. It should be appreciated that such contacts are patterned and etched from a zero-level alignment mark 50 (see FIG. 3) defined in the silicon substrate 12. The pre-metal dielectric layer 14 may be embodied as a single insulator material or may preferably be embodied as a stack of insulator materials. For example, the pre-metal dielectric layer 14 preferably includes an undoped chemical vapor deposition (CVD) TEOS oxide lower layer, a boron and phosphorous doped CVD BPTEOS intermediate layer, and a plasma enhanced chemical vapor deposition (PECVD) undoped oxide top layer. Moreover, prior to subsequent fabrication, the pre-metal dielectric layer 14 is preferably planarized such as by chemical-mechanical polishing (CMP).

Once the pre-metal dielectric layer 14 has been planarized, a first metal layer 16 is deposited on the semiconductor wafer 10, as shown in FIG. 1A. The metal layer 16 may be embodied as a single metal or may preferably be embodied as a stack of metals. For example, the metal layer 16 preferably includes a Ti/TiN/Al/TiN metal stack. Once the metal layer 16 has been deposited, a number of active features are fabricated therein. For example, metal lines and pads are fabricated in the metal layer 16 at predetermined locations in the active area of the semiconductor wafer 10. Moreover, as shown in FIG. 1B, a number of alignment trenches 18 are also fabricated in the metal layer 16. In particular, as a result of fabrication steps which include resist patterning, metal etch, resist strip, and cleaning, the trenches 18 are formed in the metal layer 16. As shown in FIG. 2, the trenches 18 define an alignment grating 20.

As shown in FIG. 1B, the etching process preferably stops at the premetal dielectric layer 14. It should be appreciated that both the active features and the trenches 18 are fabricated in the metal layer 16 contemporaneously (i.e. during the same patterning and etch steps). Moreover, it should be further appreciated that the zero-level alignment mark 50 (see FIG. 3) defined in the silicon substrate 12 is utilized to align a patterning tool such as a lithographic stepper to the semiconductor wafer 10 during fabrication (e.g. patterning) of the active features and the trenches 18 in the metal layer 16. It should be appreciated that a number of the previous fabrication steps (implantation, shallow trench isolation, etc.) are designed to preserve the zero-level alignment mark 50 so that it may be utilized during patterning of the metal layer 16.

As shown in FIG. 1C, an insulator layer is then deposited on the semiconductor wafer 10. In particular, an inter-layer dielectric layer 22 is deposited on the metal layer 16. Moreover, the inter-layer dielectric layer 22 fills the trenches 18 as shown in FIG. 1C. The inter-layer dielectric layer 22 may be any insulator material. Preferably, the inter-layer dielectric layer 22 is embodied as a layer of silicon dioxide ($SiO_2$). Typically, the inter-layer dielectric layer 22 is planarized by a CMP process after deposition thereof.

The inter-layer dielectric layer 22 is then patterned and etched. During the patterning and etching process, a number of vias are etched into the interlayer dielectric layer 22. As discussed below in more detail, such vias are later filled with a conductive material so as to selectively electrically couple the metal layer 16 to subsequent metal layers. An "ideal" via etch process would stop when an upper surface 24 of the inter-layer dielectric layer 22 is coincident with an upper surface 26 of the metal layer 16. However, in order to ensure that each of the vias in the active area of the wafer 10 has been etched down to the metal layer 16, an over-etch is performed. Thus, a first step feature $SF_1$ is created, as shown in FIG. 1D. In particular, a first step feature $SF_1$ defined by the distance from the upper surface 24 of the inter-layer dielectric layer 22 to the upper surface 26 of the metal layer 16 is created as result of the over-etch. It should be appreciated that the magnitude of the over-etch is controlled so as to yield a step feature $SF_1$ of a predetermined height. Such a predetermined height may be selected in order to optimize detection by the alignment system associated with a patterning tool such as a lithographic stepper.

As shown in FIG. 1E, a second conductor layer is then deposited on the semiconductor wafer 10. In particular, a metal interconnect layer 28 is then deposited such that a first portion 30 of the metal interconnect layer 28 is positioned on the metal layer 16 and a second portion 32 of the metal interconnect layer 28 is positioned on the inter-layer dielectric layer 22. The metal interconnect layer 28 is provided as a metal "plug" which provides an electrically conductive path through the vias (not shown) of the active areas of the wafer 10 in order to electrically couple the metal layer 16 to a subsequently deposited metal layer. The metal interconnect layer 28 may be embodied as a single metal or may preferably be embodied as a stack of metals. For example, the metal interconnect layer 28 preferably includes a Ti/TiN/W metal stack. More specifically, a titanium (Ti) layer is first deposited by physical vapor deposition (PVD), collimated PVD, or ionized PVD. A titanium-nitride (TiN) layer is then deposited by PVD, collimated PVD or ionized PVD. The tungsten (W) layer is then deposited on the Ti/TiN layers by CVD. As alluded to above, collectively the Ti/TiN/W stack is utilized to fill the via holes with a composite metal plug in order to provide a conductive path between the metal layer 16 and a subsequently deposited layer.

As shown in FIG. 1E, a second step feature $SF_2$ of the alignment grating 20 defined by the distance from an upper surface 34 of the second portion 32 of the metal interconnect layer 28 to an upper surface 36 of the first portion 30 of the metal interconnect layer 28. It should be appreciated that the second step feature $SF_2$ has the same predetermined height as the first step feature $SF_1$. As shown in FIG. 1F, the metal interconnect layer 28 is then planarized by use of, for example, a CMP technique. In particular, the metal interconnect layer 28 is planarized such that the material associated with the metal interconnect layer 28 is removed from an upper portion 38 of the inter-layer dielectric layer 22. However, because the target for the stepper's alignment system (i.e. the alignment grating 20) is recessed below the upper portion 38 of the inter-layer dielectric layer 22, the polishing pad (not shown) of the CMP system does not come in contact with the target (i.e. the alignment grating 20) thereby avoiding or otherwise preventing distortion of the alignment grating 20 and/or changes in the height of the step features (i.e. $SF_1$ and $SF_2$). Moreover, it should be appreciated the size and shape of the "clear out" area around the target (i.e. the alignment grating 20) is predetermined such that the polishing pad of the CMP system is unable to contact the target.

It should also be appreciated that the tungsten plugs in the via holes could also be formed by use of a tungsten etch-back process. In such a case, the tungsten will be removed from the alignment gratings 20, but the other metals (i.e. Ti and TiN) associated with the metal interconnect layer 28 would remain intact.

It should be appreciated that in the case of where the metal interconnect layer 28 is planarized by use of tungsten CMP, tungsten remains in the alignment gratings 20. Although, the resulting tungsten layer possesses a rough, crystalline metal surface, experimentation has shown that such roughness does not render the alignment mark defined by the alignment grating 20 undetectable to the alignment system associated with a lithographic stepper. This is true since the underlying diffraction grating still results in a relatively strong signal of light diffracted to the first order of the grating. Moreover, since the entire area around the alignment grating 20 is recessed relative to the upper portion 38 of the inter-layer dielectric layer 22, significant erosion of the alignment grating 20 is prevented.

As shown in FIG. 1G, a second metal layer 40 is then deposited on the semiconductor wafer 10. The metal layer 40 is deposited such that a first portion 42 of the metal layer 40 is positioned on the first portion 30 of the metal interconnect layer 28 and a second portion 44 of the metal layer 40 is positioned on the second portion 32 of the metal interconnect layer 28. As with the metal layer 16, the metal layer 40 may be embodied as a single metal or may preferably be embodied as a stack of metals. For example, the metal layer 40 preferably includes a Ti/TiN/Al/TiN metal stack. A third step feature $SF_3$ of the alignment grating 20 is defined by the distance from an upper surface 46 of the second portion 44 of the metal layer 40 to an upper surface 48 of the first portion 42 of the metal layer 40. It should be appreciated that the third step feature $SF_3$ has the same predetermined height as the first step feature $SF_1$ and the second step feature $SF_2$.

The layer-to-layer alignment mark defined by the alignment grating 20 is then utilized to pattern a number of active features on the metal layer 40. In particular, in lieu of using the zero-level alignment mark 50, the alignment mark defined by the alignment grating 20 is utilized to pattern a number of active features such as metal lines and pads in the metal layer 40 at locations within an active area of the semiconductor wafer 10. Such patterned active features are subsequently fabricated in the metal layer 40 by use of, for example, an etch process. Moreover, a number of trenches similar to the trenches 18 (see FIG. 1B) are fabricated at a location on the semiconductor wafer 10 remote from the trenches 18. Such trenches will be utilized to fabricate a second alignment grating which is similar to the alignment grating 20 so as to define a second alignment mark which may be utilized during fabrication of subsequent layers. In particular, a second inter-layer dielectric layer (not shown) may be fabricated by depositing and thereafter patterning and etching the second inter-layer dielectric layer on the semiconductor wafer 10. It should be appreciated that the patterning of the second inter-layer dielectric layer is aligned by use of the alignment mark defined by the alignment grating 20. It should be further appreciated that material associated with the second inter-layer dielectric layer is deposited and etched in the trenches associated with the second metal layer 40 so as to define a step feature in a manner similar to the fabrication of the first step feature $SF_1$ (see FIG. 1D).

As described herein, the wafer fabrication method of the present invention provides numerous advantages over heretofore designed wafer fabrication methods. For example, the wafer fabrication method of the present invention provides a layer-to-layer alignment scheme which eliminates the need to "clear" the zero-level alignment mark subsequent to each fabrication step. Moreover, the wafer fabrication method of the present invention provides an alignment mark for use in a layer-to-layer alignment scheme which is not rendered undetectable by certain manufacturing processes such as tungsten CMP.

Moreover, it should be appreciated that although the fabrication technique of the present invention is herein described as being utilized during "metal one" fabrication (i.e. the first conductor layer deposited on the pre-metal dielectric layer), other configurations are also possible for use with the concepts of the present invention. For example, the zero-level alignment mark 50 may be utilized to fabricate the first three metal layers (i.e. the first metal layer 16, the second metal layer 40, and a subsequent third metal layer), including the interlayer dielectric layers associated therewith, with an alignment grating similar to the alignment grating 20 being fabricated in the third metal layer for use in aligning a fourth metal layer (and the associated inter-layer dielectric layer) to the previous layers in the manner previously discussed. It should be appreciated that in such an arrangement, a number of dedicated processing steps may be required to preserve the zero-level alignment mark 50 for use in fabrication of the first three metal layers (including the inter-layer dielectric layers associated therewith).

It should be further appreciated that the fabrication technique of the present invention may also be utilized to fabricate any number of subsequent metal layers and inter-layer dielectric layers. For example, as described herein, the first metal layer 16 and the first inter-layer dielectric layer 22 are both patterned by alignment with the zero-level alignment mark 50, with a subsequent metal layer (i.e. metal layer 40) and its associated inter-layer dielectric layer being patterned by alignment with the layer-to-layer alignment mark defined by the alignment grating 20. In a similar manner, a layer-to-layer alignment mark defined in the metal layer 40 may be utilized to pattern a third metal layer (including its associated inter-layer dielectric layer) which in turn may include a layer-to-layer alignment mark for patterning a fourth metal layer(including its associated inter-layer dielectric layer), and so on.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

There are a plurality of advantages of the present invention arising from the various features of the wafer fabrication process described herein. It will be noted that alternative embodiments of the wafer fabrication process of the present invention may not include all of the features described yet still benefit from at least some of the advantages of such features. Those of ordinary skill in the art may readily devise their own implementations of the wafer fabrication process that incorporate one or more of the features of the present invention and fall within the spirit and scope of the present invention as defined by the appended claims.

What is claimed is:

1. A semiconductor wafer, comprising:
   a substrate;
   a first conductor layer deposited on said substrate, said first conductor layer having a number of alignment trenches formed therein so as to define an alignment grating;

a first insulator layer fabricated on said first conductor layer such than an upper surface of a portion of said first conductor layer positioned in said alignment trenches and an upper surface of said first insulator layer create a first alignment step feature which possesses a height; and a second conductor layer deposited on said first conductor layer and said first insulator layer so as to create a second alignment step feature which possesses said height, wherein said second alignment step feature is configured so as to be utilized by an alignment tool in order to align said alignrnent tool to said semiconductor wafer.

2. The semiconductor wafer of claim 1, further comprising a third conductor layer deposited on said second conductor layer so as to create a third alignment step feature which possesses said height, wherein said second alignment step feature is configured so as to be utilized by said alignment tool in order to align said alignment tool to said semiconductor wafer during fabrication of a number of circuit features in said third conductor layer.

3. The semiconductor wafer of claim 2, further comprising a second insulator layer deposited on said third conductor layer, wherein said third alignment step feature is configured so as to be utilized by said alignment tool in order to align said alignment tool to said semiconductor wafer during patterning of a mask on said second insulator layer.

4. The semiconductor wafer of claim 1, further comprising:

a pre-conductor insulator layer deposited on said substrate such that said pre-conductor layer is interposed between said substrate and said first conductor layer.

* * * * *